(12) United States Patent
Tada et al.

(10) Patent No.: US 8,450,130 B2
(45) Date of Patent: May 28, 2013

(54) METHOD OF MANUFACTURING A SEMICONDUCTOR LASER

(75) Inventors: Kentaro Tada, Kanagawa (JP); Kenji Endo, Kanagawa (JP); Kazuo Fukagai, Kanagawa (JP); Tetsuro Okuda, Kanagawa (JP); Masahide Kobayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/527,188

(22) Filed: Jun. 19, 2012

(65) Prior Publication Data
US 2012/0258558 A1 Oct. 11, 2012

Related U.S. Application Data

(62) Division of application No. 12/710,607, filed on Feb. 23, 2010, now Pat. No. 8,228,966.

(30) Foreign Application Priority Data

Feb. 27, 2009 (JP) ................................. 2009-046074

(51) Int. Cl.
*H01L 21/223* (2006.01)
*H01L 21/225* (2006.01)

(52) U.S. Cl.
USPC ............... 438/45; 438/46; 438/47; 438/544; 438/558; 438/567; 257/E21.142; 257/E21.152

(58) Field of Classification Search
USPC ............... 438/45, 544, 567, 551, 552, 556, 438/558, 561, 46, 47; 257/E21.142, E21.152
See application file for complete search history.

(56) References Cited

U.S. PATENT DOCUMENTS

| 4,213,808 | A | * | 7/1980 | Thompson et al. | ............. 438/45 |
|---|---|---|---|---|---|
| 4,446,557 | A | * | 5/1984 | Figueroa | ............ 372/45.01 |
| 4,987,097 | A | * | 1/1991 | Nitta et al. | ............ 438/44 |
| 5,023,199 | A | * | 6/1991 | Murakami et al. | ............ 438/47 |
| 6,633,597 | B1 | * | 10/2003 | Abe | ............ 372/45.01 |
| 7,723,233 | B2 | * | 5/2010 | Krull et al. | ............ 438/690 |
| 8,030,188 | B2 | * | 10/2011 | Park et al. | ............ 438/483 |
| 8,228,966 | B2 | * | 7/2012 | Tada et al. | ............ 372/46.015 |
| 8,236,675 | B2 | * | 8/2012 | Krull et al. | ............ 438/528 |
| 2002/0098666 | A1 | * | 7/2002 | Sugiura et al. | ............ 438/563 |

(Continued)

FOREIGN PATENT DOCUMENTS

| JP | 10-290043 | * 10/1998 |
|---|---|---|
| JP | 2006-319120 | 11/2006 |
| JP | 2007-318077 | * 12/2007 |

*Primary Examiner* — Mary Wilczewski
(74) *Attorney, Agent, or Firm* — Young & Thompson

(57) ABSTRACT

Provided is a semiconductor laser, wherein $(\lambda a - \lambda w) > 15$ (nm) and $Lt < 25$ (μm), where $\lambda w$ is the wavelength of light corresponding to the band gap of the active layer disposed at a position within a distance of 2 μm from one end surface in a resonator direction, $\lambda a$ is the wavelength of light corresponding to the band gap of the active layer disposed at a position that is spaced a distance of equal to or more than $(3/10)L$ and $\leq (7/10)L$ from the one end surface in a resonator direction, "L" is the resonator length, and "Lt" is the length of a transition region provided between the position of the active layer with a band gap corresponding to a light wavelength of $\lambda w + 2$ (nm) and the position of the active layer with a band gap corresponding to a light wavelength of $\lambda a - 2$ (nm) in the resonator direction.

15 Claims, 16 Drawing Sheets

U.S. PATENT DOCUMENTS

2005/0058170 A1* 3/2005 Itoh et al. .......................... 372/44
2010/0022077 A1* 1/2010 Krull et al. ...................... 438/558
2010/0200899 A1* 8/2010 Marukame et al. ........... 257/295
2012/0258558 A1* 10/2012 Tada et al. ....................... 438/42
2012/0307856 A1* 12/2012 Nishioka et al. ........... 372/45.01

* cited by examiner

FIG. 5
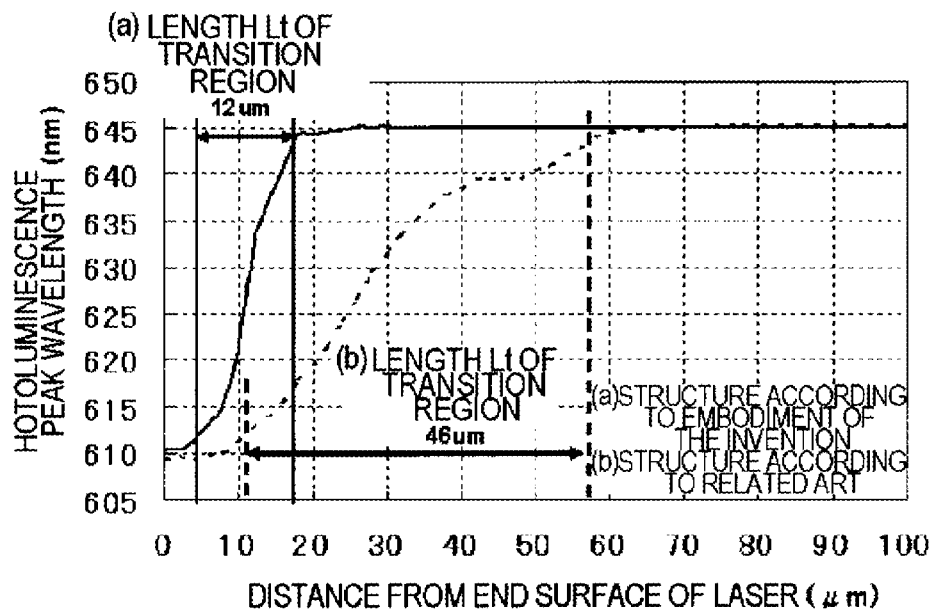
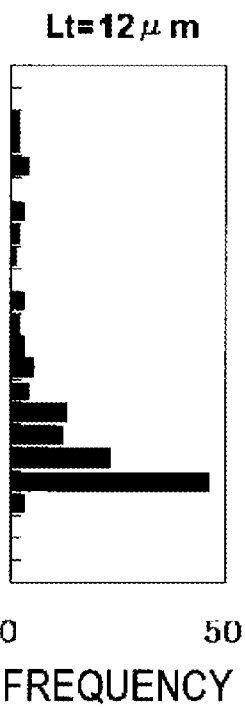
FIG. 6A
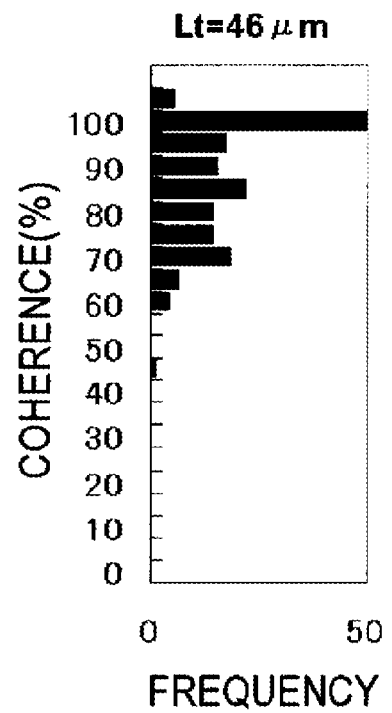
FIG. 6B

CROSS-SECTIONAL VIEW
TAKEN ALONG LINE D-D

CROSS-SECTIONAL VIEW
TAKEN ALONG LINE E-E

METHOD OF MANUFACTURING A SEMICONDUCTOR LASER

CROSS REFERENCE TO RELATED APPLICATIONS

This application is a division of co-pending application Ser. No. 12/710,607 filed on Feb. 23, 2010, which claims foreign priority to Japanese patent application No. 2009-046074 filed on Feb. 27, 2009. The entire content of each of these applications is hereby expressly incorporated by reference.

BACKGROUND

1. Technical Field

The present invention relates to a semiconductor laser and a method of manufacturing a semiconductor laser.

2. Related Art

As a technique for preventing the deterioration of an end surface due to optical damage in semiconductor lasers, a technique has been proposed in which a window structure that does not absorb laser oscillation light is provided at an end surface.

For example, Japanese Unexamined Patent Publication No. 2006-319120 discloses an improved semiconductor laser that prevents the diffusion of impurities.

FIGS. 16A to 16C show a process of manufacturing the semiconductor laser. First, a ZnO layer 201 is selectively etched and a p-GaAs contact layer 109 where a gain region 004 is to be formed is selectively etched (FIG. 16A). Then, a dielectric film 202 is formed on the entire surface of a wafer (FIG. 16B). Then, a heat treatment (annealing) is performed to diffuse Zn in the ZnO layer 201 into an active layer 104 in a solid phase (FIG. 16C).

In this way, in the semiconductor laser, Zn is diffused from only a portion coming into contact with the p-GaAs contact layer 109. Therefore, the diffusion of impurities is prevented as compared to a structure in which the impurities are diffused with a contact layer provided on the entire surface.

In addition, Japanese Unexamined Patent Publication No. 2006-319120 also discloses a structure in which partition regions including impurities are provided on both sides of a Zn-diffused region, thereby preventing the diffusion of impurities into an active layer in gain regions provided on both sides of a window region due to annealing.

In the semiconductor laser disclosed in Japanese Unexamined Patent Publication No. 2006-319120, as shown in FIGS. 16A, 16B, and 16C, a p-GaAs contact layer 109 is formed only in a region where a window region is to be formed in which the ZnO layer 201 on the active layer 104 is formed, and the p-GaAs contact layer 109 is removed from most of the gain region. As described in the specification or the drawings of Japanese Unexamined Patent Publication No. 2006-319120, in portions other than the window, the subsequent manufacturing process is performed with the surface of the p-type GaInP clad layer 107 being exposed.

However, it is known in this technical field that a defect is more likely to occur in the vicinity of the surface of a layer made of GaInP or AlGaInP than a layer made of GaAs due to, for example, a heat treatment or a plasma process. Therefore, a crystal defect is likely to occur in the exposed p-type GaInP clad layer 107 due to a thermal history of a manufacturing process. The defect is spread into a crystal by the heat treatment, and interdiffuses elements forming the crystal. Therefore, in the active layer 104 in the gain region, alloying occurs due to the interdiffusion of the crystal, which may result in a variation in band gap.

Even though the diffusion of Zn in the lateral direction is prevented, it is difficult to prevent the alloying of the active layer in the gain region where the p-GaAs contact layer 109 is not provided with high reproducibility.

Although the band gap of the active layer is not described in detail in Japanese Unexamined Patent Publication No. 2006-319120, the band gap of the active layer is likely to be widened due to alloying in the gain region where the ZnO layer 201 is not formed.

Japanese Unexamined Patent Publication No. 2007-318077 discloses an improved semiconductor laser that prevents the generation of a crystal defect due to process damage.

FIGS. 17A to 17D show a process of manufacturing the semiconductor laser. First, an n-type AlGaInP clad layer 3, an active layer 4, a first p-type AlGaInP clad layer 5, a p-type etching stop layer 6, a second p-type AlGaInP clad layer 7, a p-type barrier reduction layer 8, and a p-type GaAs cap layer 9 are sequentially formed on an n-type GaAs substrate 2, and the p-type GaAs cap layer 9 near the end surface of a resonator is removed to form an opening. Then, a ZnO layer 11 is formed in the opening, and a heat treatment is performed to diffuse Zn included in the ZnO layer 11 into the active layer 4, thereby forming a window region M. Then, a strip-shaped insulating film mask pattern 16 is formed in a resonator direction so as to cover the window region M. Then, only the p-type GaAs cap layer 9 is removed by a selective etching solution to form a ridge portion 17. According to Japanese Unexamined Patent Publication No. 2007-318077, it is possible to improve a manufacturing yield.

In a method of manufacturing the semiconductor laser disclosed in Japanese Unexamined Patent Publication No. 2007-318077, as shown in FIG. 17D, a heat treatment is performed while the ZnO layer 11 and the p-type GaAs cap layer 9 are provided on the same layer so as to come into contact with each other, thereby diffusing Zn in the ZnO layer 11 into the active layer 4. In this case, Zn is diffused in the resonator direction through the p-type GaAs cap layer 9. As a result, a non-gain region of the active layer is widened, which causes an increase in threshold current value.

When the volume of the non-gain region is large in the active layer, a sufficient gain is not obtained, which results in an increase in threshold current value. In particular, this phenomenon is remarkable in the laser that has a relatively small resonator length and is for playing back an optical disk. In addition, in devices using a fine balance between the gain and the loss, such as self-oscillation lasers, it is very difficult to generate self-oscillation.

As described above, the related art disclosed in Japanese Unexamined Patent Publication Nos. 2006-319120 and 2007-318077 has the following problems.

First, since impurities are diffused in the resonator direction of the active layer, the non-gain region is widened, which causes an increase in threshold current value.

Second, since a crystal defect occurs due to process damage, it is difficult to control the alloying of the active layer with high reproducibility.

SUMMARY

In one embodiment, there is provided a semiconductor laser including: a substrate; and an active layer that is provided over the substrate. The active layer in a region near at least one end surface is alloyed by the diffusion of impurities. The band gap of the active layer in the region near the end surface is wider than that of the active layer in a region other than the region near the end surface. In this semiconductor (λa−λw)>(more than) 15 (nm) and Lt is less than 25 (μm), where "λw (nm)" is the wavelength of light corresponding to the band gap of the active layer disposed at a position within a distance of 2 μm from one end surface in a resonator direction, "λa (nm)" is the wavelength of light corresponding to the band gap of the active layer disposed at a position that is spaced a distance of equal to or more than (3/10)L and equal to or less than (7/10)L from the one end surface in a resonator direction, "L" is the resonator length, and "Lt" is the length of a transition region provided between the position of the active layer with a band gap corresponding to a light wavelength of λw+2 (nm) and the position of the active layer with a band gap corresponding to a light wavelength of λa−2 (nm) in the resonator direction.

In a process of manufacturing the semiconductor laser in which λa−λw>15 nm and Lt is less than 25 μm, it is possible to reduce a threshold current value by reducing Lt and sharply changing the band gap of the active layer in the region near the end surface.

In another embodiment, there is provided a method of manufacturing a semiconductor laser including: forming an active layer over a substrate; and diffusing impurities into a region near an end surface of the active layer to alloy the active layer. The step of alloying the active layer includes: preparing a semiconductor layer A and a semiconductor layer B; sequentially forming the semiconductor layer B and the semiconductor layer A over the active layer when the solid solubility limit concentration of the semiconductor layer A with respect to the impurities is Ma and the solid solubility limit concentration of the semiconductor layer B with respect to the impurities is Mb (Ma>Mb); forming a groove in the semiconductor layer A between a region where the region near the end surface is to be formed and a region where a region other than the region near the end surface is to be formed; and forming a layer including the impurities so as to come into contact with only the surface of the first semiconductor layer A in the region where the region near the end surface is to be formed or exposing only the surface of the semiconductor layer A in the region where the region near the end surface is to be formed to a gas including the impurities, and diffusing the impurities into the active layer in the region where the region near the end surface is to be formed through the semiconductor layer A and the semiconductor layer B.

According to the method of manufacturing a semiconductor laser, it is possible to manufacture the semiconductor laser in which the band gap of the active layer in the region near the end surface is sharply changed.

That is, the groove is formed in the semiconductor layer A to separate a region where the region near the end surface is to be formed from a region where a region other than the region near the end surface is to be formed, and impurities are diffused while a layer including impurities or a gas including impurities comes into contact with only the surface of the semiconductor layer A in the region where the region near the end surface is to be formed. In this way, it is possible to prevent impurities from being diffused into the semiconductor layer A in a region, which will be the region other than the region near the end surface, over the groove.

In addition, since Ma>Mb, impurity concentration is saturated in a predetermined region or more of the semiconductor layer A, and impurities are diffused into the semiconductor layer B. In other words, it is possible to prevent impurities from being diffused into the semiconductor layer B in the resonator direction at the same time as the impurities start to be diffused into the semiconductor layer A.

In addition, the subsequent manufacturing process is performed with the semiconductor layer A remaining in the region where the region other than the region near the end surface is to be formed. Therefore, it is possible to prevent the occurrence of a crystal defect due to process damage.

In still another embodiment, there is provided a method of diffusing impurities into a semiconductor layer B through a semiconductor layer A. The method includes: preparing the semiconductor layer A and the semiconductor layer B; forming the semiconductor layer A over the semiconductor layer B when the solid solubility limit concentration of the semiconductor layer A with respect to the impurities is Ma and the solid solubility limit concentration of the semiconductor layer B with respect to the impurities is Mb (Ma>Mb); forming a groove in the semiconductor layer A, to form a first semiconductor layer A and a second semiconductor layer A over the semiconductor layer B; and forming a layer including the impurities so as to come into contact with only the surface of the first semiconductor layer A and diffusing the impurities into the semiconductor layer B through the first semiconductor layer A.

According to the above-mentioned embodiments of the invention, it is possible to provide a structure capable of preventing the deterioration of an end surface due to optical damage and producing a semiconductor laser having a small threshold current with high yield and a method of manufacturing the same.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 5 is a graph illustrating a variation in the photoluminescence wavelength (band gap) of an active layer in a resonator direction from the end surface of the semiconductor laser;

FIGS. 6A and 6B are histograms illustrating the coherence (self-oscillation intensity) of the semiconductor laser;

DETAILED DESCRIPTION

Figure 1:
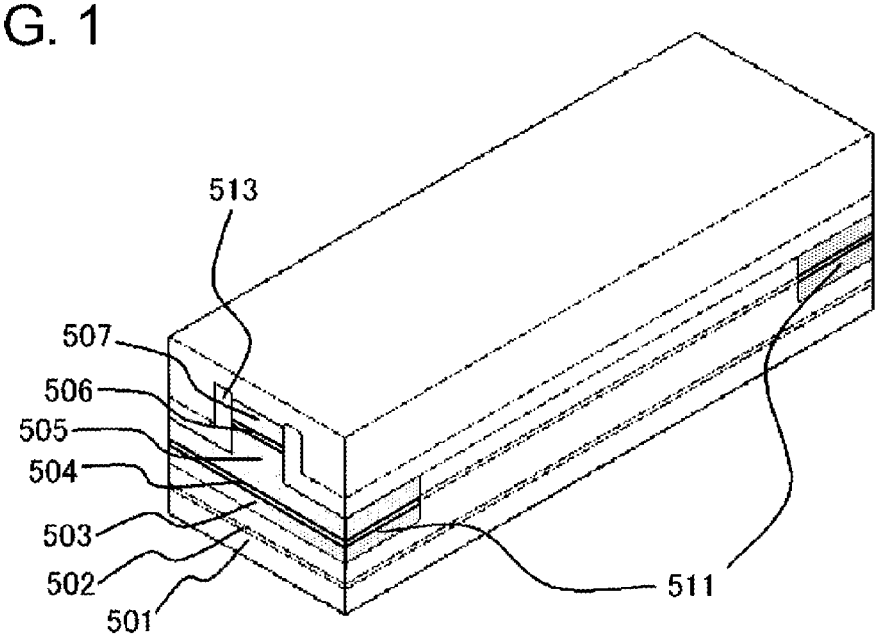
FIG. 1 is a perspective view illustrating the structure of a semiconductor laser according to a first embodiment of the invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, exemplary embodiments of the invention will be described with reference to the accompanying drawings. In the drawings, the same components are denoted by the same reference numerals and description thereof will not be repeated.

First Embodiment

A first embodiment of the invention will be described with reference to FIGS. 1 and 2.

FIG. 1 is a perspective view illustrating the structure of a semiconductor laser according to the first embodiment. FIG. 2 is a perspective view illustrating the semiconductor laser when a portion of the structure shown in FIG. 1 is removed to facilitate understanding of an internal structure. In the drawings, a dark color portion indicates a Zn-diffused region 511.

The semiconductor laser according to the first embodiment is a self-oscillation semiconductor laser having a window structure at the end thereof.

The semiconductor laser includes a substrate (n-type GaAs substrate 501) and an active layer (quantum well active layer 504) that is provided on the n-type GaAs substrate 501. In the window structure of the semiconductor laser, the quantum well active layer 504 of at least one region near an end surface is alloyed by the diffusion of impurities, the band gap of the quantum well active layer 504 of the region near the end surface is wider than that of the quantum well active layer 504 of regions other than the region near the end surface. In this embodiment, Zn is used as the impurities, but the invention is not limited thereto. Various kinds of metal materials may be used as the impurities.

As shown in FIG. 1, in the Zn-diffused region 511, Zn is diffused and the concentration of Zn is increased. In the Zn-diffused region 511, the band gap of the quantum well active layer 504 is wider than those of the other portions.

In the semiconductor laser, the wavelength of light corresponding to the band gap of the quantum well active layer 504 disposed at a position within a distance of 2 μm from one end surface in the resonator direction is $\lambda w$ (nm), a resonator length is L, and the wavelength of light corresponding to the band gap of the quantum well active layer 504 disposed at a position that is spaced a distance of equal to or more than $(3/10)L$ and equal to or less than $(7/10)L$ from the other end surface in the resonator direction is $\lambda a$ (nm). In addition, a transition region is arranged between the position of the quantum well active layer 504 with a band gap corresponding to a light wavelength of $\lambda w+2$ (nm) and the position of the quantum well active layer 504 with a band gap corresponding to a light wavelength of $\lambda a-2$ (nm) in the resonator direction, and the length of the transition region is Lt. In this case, $\lambda a-\lambda w>15$ (in other word, "$\lambda a-\lambda w$" is more than 15) nm and Lt is less than 25 μm.

Figure 2:
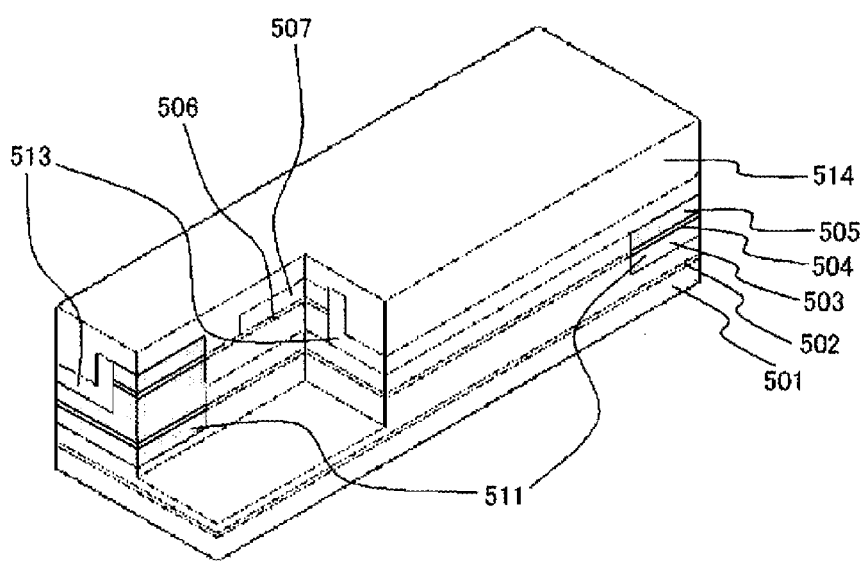
FIG. 2 is a perspective view illustrating the structure of the semiconductor laser according to the first embodiment of the invention.

The semiconductor laser according to this embodiment includes an n-type GaInP hetero-barrier reduction layer 502, an n-type AlGaInP clad layer 503, a p-type AlGaInP clad layer 505, a p-type GaInP hetero-barrier reduction layer 506, a p-type GaAs cap layer 507, an n-type AlInP/GaAs current block layer 513, a p-type GaAs contact layer 514, an n electrode (not shown), and a p electrode (not shown), as shown in FIGS. 1 and 2.

In addition, a double hetero structure including the quantum well active layer 504, the n-type AlGaInP clad layer 503, and the p-type AlGaInP clad layer 505 is formed. A current block layer may be a single layer or a multi-layer structure. In this embodiment, a multi-layer structure (n-type AlInP/GaAs current block layer 513) is used as the current block layer.

As shown in FIGS. 1 and 2, the n-type GaInP hetero-barrier reduction layer 502, the n-type AlGaInP clad layer 503, the quantum well active layer 504, the p-type AlGaInP clad layer 505, the p-type GaInP hetero-barrier reduction layer 506, the p-type GaAs cap layer 507, and the p-type GaAs contact layer 514 are stacked on the n-type GaAs substrate 501. In addition, a ridge portion (ridge-shape stripe) is formed on the p-type AlGaInP clad layer 505. A current narrowing structure including the n-type AlInP/GaAs current block layer 513 is formed on side of a ridge (a side wall of the ridge-shaped p-type AlGaInP clad layer 505). The n electrode (not shown) is formed below the n-type GaAs substrate 501 and the p electrode is formed on the p-type GaAs contact layer 514.

As shown in FIG. 2, a groove (separation groove) is formed in the p-type GaAs cap layer 507 between the region near the end surface and a region other than the region near the end surface. The groove causes the p-type GaAs cap layer 507 in which Zn is diffused to be formed in the region near the end surface and causes the p-type GaAs cap layer 507 that does not include Zn, expect for that included in the processes before a Zn diffusion process, to be formed on the quantum well active layer 504 of a gain region.

According to the above-mentioned structure, it is possible to form a self-oscillation semiconductor laser in which a saturable absorption region is formed on side of a ridge. In addition, it is possible to appropriately adjust a difference in refractive index between a ridge portion and both on side of the ridge and a ridge width. The resonator length L is not particularly limited. For example, the resonator length L may be equal to or less than 500 μm. The semiconductor laser according to this embodiment may have a ridge-shaped stripe or a ridge-buried stripe.

Next, a method of manufacturing the first embodiment will be described with reference to FIGS. 3A and 3B and FIGS. 4A and 4B.

FIGS. 3A and 3B and FIGS. 4A and 4B are diagrams illustrating the procedure of the method of manufacturing the semiconductor laser according to the first embodiment. In the drawings, a portion corresponding to one semiconductor laser element in the wafer is shown. However, in the actual manufacturing process, a plurality of elements is two-dimensionally arranged on the wafer.

The method of manufacturing the semiconductor laser according to this embodiment includes a process of forming an active layer (quantum well active layer 504) on a substrate (n-type GaAs substrate 501), a process of diffusing impurities into a region near the end surface of the quantum well active layer 504, to alloy the quantum well active layer 504. In this way, it is possible to form a window structure in the quantum well active layer 504 of the region near the end surface in which the impurities are diffused.

The process of alloying the quantum well active layer 504 includes the following processes (1) to (3):

Process (1): a semiconductor layer A and a semiconductor layer B are prepared, the solid solubility limit concentration of the semiconductor layer A with respect to impurities is Ma, the solid solubility limit concentration of the semiconductor layer B with respect to impurities is Mb (Ma>Mb, that is Ma is lager than Mb), and the semiconductor layer B and the semiconductor layer A are sequentially formed on the quantum well active layer 504;

Process (2): a groove is formed in the semiconductor layer A between a region where the region near the end surface is to be formed and a region where the region other than the region near the end surface is to be formed; and Process (3): a layer including impurities is formed so as to come into contact with only the surface of the semiconductor layer A in the region where the region near the end surface is to be formed, and impurities are diffused into the quantum well active layer 504 in the region where the region near the end surface is to be formed through the semiconductor layer A and the semiconductor layer B.

The semiconductor layer A may be made of any material as long as the material includes GaAs. The semiconductor layer B may be made of any material as long as the material includes GaInP, AlGaInP or AlGaAs.

In this embodiment, the semiconductor layer A is the p-type GaAs cap layer 507, the semiconductor layer B is the p-type AlGaInP clad layer 505, and the impurities are Zn.

Next, the processes (1), (2) and (3) will be described in detail.

[Process (1)]

First, the n-type GaInP hetero-barrier reduction layer 502 (thickness: 0.02 µm), the n-type AlGaInP clad layer 503 (thickness: 1.2 µm), the quantum well active layer 504 (a septuple quantum well including a GaInP well layer with a thickness of 0.006 µm and an AlGaInP barrier layer with a thickness of 0.005 µm), the p-type AlGaInP clad layer 505 (thickness: 1.2 µm), the p-type GaInP hetero-barrier reduction layer 506 (thickness: 0.02 µm), and the p-type GaAs cap layer 507 (thickness: 0.3 µm) are epitaxially grown on the n-type GaAs substrate 501 by a metal organic chemical vapor deposition (MOCVD) method.

[Process (2)]

Then, a SiO$_2$ film (thickness: 0.1 µm) is formed on the p-type GaAs cap layer 507 by a chemical vapor deposition (CVD) method, and a portion of the SiO$_2$ film is opened by photolithography and wet etching.

The length of the opening in the resonator direction is 7.5 µm, and one end of the opening close to the end surface is spaced a distance of 12.5 µm from the end surface. A portion of the p-type GaAs cap layer 507 disposed immediately below the opening is removed by wet etching.

Figure 3A:
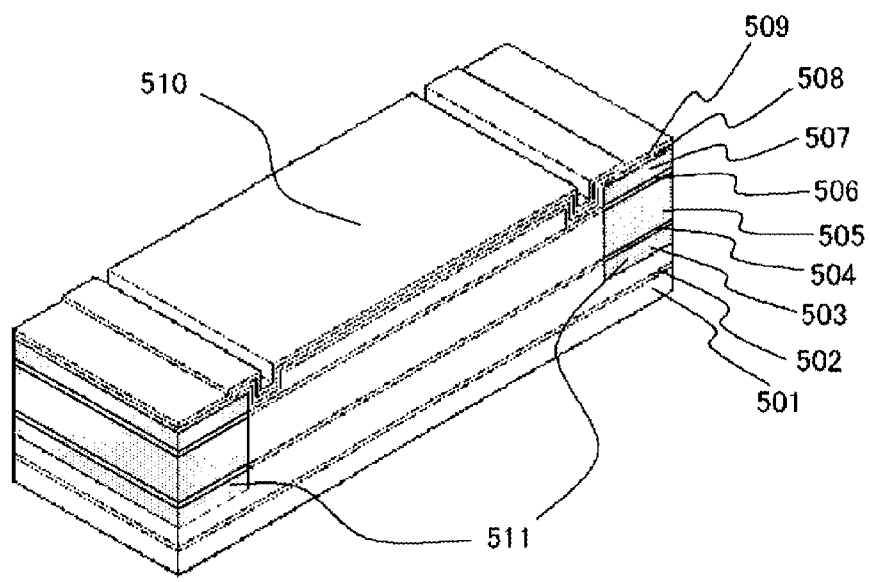
FIGS. 3A and 3B are diagrams illustrating a process of manufacturing the semiconductor laser according to the first embodiment of the invention.

In this way, as shown in FIG. 3A, a groove is formed in the p-type GaAs cap layer 507 in a direction orthogonal to the resonator direction. Therefore, it is possible to separate a region where the region near the end surface is to be formed and a region where the region other than the region near the end surface (gain region) is to be formed in the p-type GaAs cap layer 507.

[Process (3)]

Then, after the SiO$_2$ film is completely removed, a SiO$_2$ film 508 (thickness: 0.2 µm) is formed by the CVD method, and an opening is formed in the vicinity of the center of an end surface when the film is cleaved to a laser chip. In this case, the length of the opening in the resonator direction is 20 µm.

Then, a ZnO film 509 (thickness: 0.1 µm) and a SiO$_2$ film 510 (thickness: 0.1 µm) are formed by a sputtering method.

In this way, as shown in FIG. 3A, it is possible to form a layer (SiO$_2$ film 508) for preventing the diffusion of impurities, in the groove. The SiO$_2$ film 508 may be formed so as to fill up the groove. The SiO$_2$ film 508 prevents Zn from being diffused into the p-type GaAs cap layer 507 in the resonator direction. The layer for preventing the diffusion of impurities is not limited to the SiO$_2$ film 508, but various kinds of material may be used.

Then, a heat treatment is performed at a temperature of 580° C. for 20 minutes to diffuse Zn from the ZnO film 509 to the p-type GaAs cap layer 507, the p-type GaInP hetero-barrier reduction layer 506, and the quantum well active layer 504 and diffuse Zn to a depth of about 0.2 µm from the surface of the quantum well active layer 504 (FIG. 3A).

In this case, since the ZnO film 509 is contacted with the semiconductor on side of the end surface than a region in which the p-type GaAs cap layer 507 is removed, Zn is not diffused to the inside of the resonator over the removed region (groove). Since the surface of the p-type GaInP hetero-barrier reduction layer 506 is less stable with respect to a process, such as a heat treatment or a plasma process, than the surface of the p-type GaAs cap layer 507, the size of the region in which the p-type GaAs cap layer 507 is removed is preferably small, other than 0. When the region is applied to a semiconductor laser, the size of the region in the resonator direction is preferably in the range 2 to 15 µm. In addition, it is preferable that a film coming into contact with the semiconductor with a large area, such as the SiO$_2$ film 508, be formed by a CVD method that causes less damage to the film than a sputtering method.

In the next process of this embodiment, the p-type GaAs cap layer 507 may remain on the p-type AlGaInP clad layer 505 in a region where the region other than the region near the end surface is to be formed (FIG. 2). In addition, the p-type GaAs cap layer 507 may remain on the p-type AlGaInP clad layer 505 in a region where the region near the end surface is to be formed (FIG. 2). In this way, it is possible to reduce process damage.

Figure 3B:
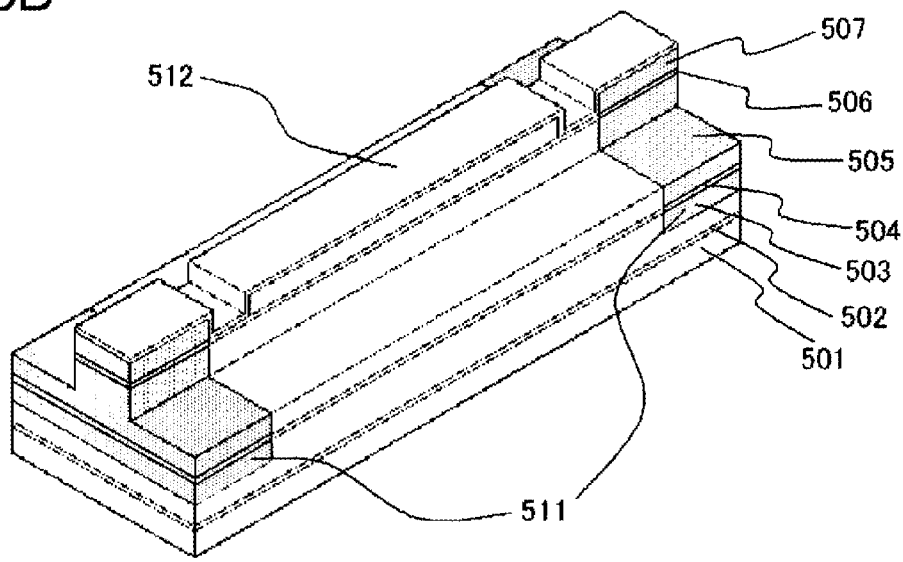

Then, the SiO$_2$ film 508, the ZnO film 509, and the SiO$_2$ film 510 are removed by wet etching, and a new SiO$_2$ film 512 (thickness: 0.2 µm) is formed. Then, the SiO$_2$ film 512 is processed into a strip with a width of 3 µm to 5 µm by photolithography and wet etching, and the semiconductor is removed up to a position of 0.2 µm to 0.4 µm above the surface of the quantum well active layer 504 by wet etching. In this way, a ridge-shaped strip is formed (FIG. 3B).

Figure 4A:
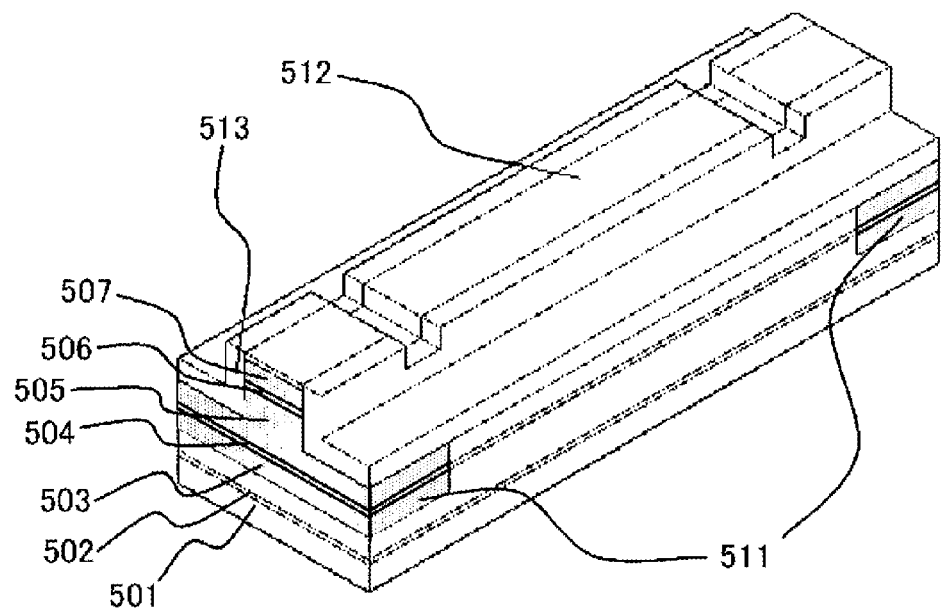
FIGS. 4A and 4B are diagrams illustrating the process of manufacturing the semiconductor laser according to the first embodiment of the invention.

Then, the n-type AlInP/GaAs current block layer 513 (thickness: 1.0 µm) made of n-type AlInP or n-type GaAs, or a combination thereof is stacked on both sides of the ridge by an MOCVD method while the strip-shaped SiO$_2$ film 512 remains (FIG. 4A).

Figure 4B:
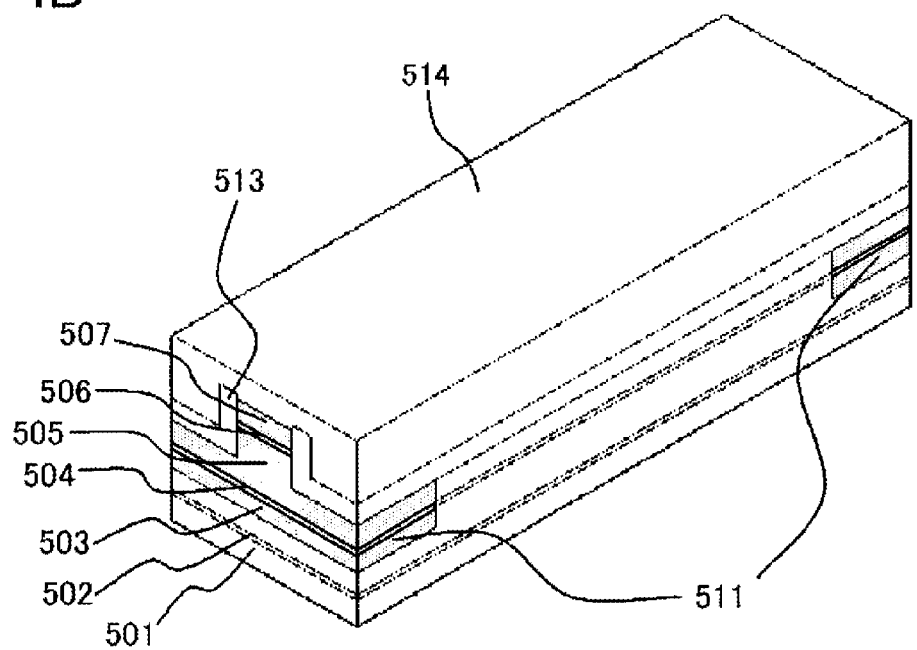

Then, the strip-shaped SiO$_2$ film 512 is removed by wet etching and the p-type GaAs contact layer 514 (thickness: 2 µm) is stacked (FIG. 4B).

Then, the p electrode is formed on the p-type GaAs contact layer 514, and the entire wafer is processed such that the thickness thereof is about 100 μm. Then, the n electrode is formed on the lower surface of the n-type GaAs substrate 501. Then, the wafer is cleaved such that the region having Zn diffused therein (Zn-diffused region 511) includes the end surface, and is divided into individual semiconductors. The semiconductor laser chip according to this embodiment is obtained by the above-mentioned processed.

Next, the mechanism that the lateral diffusion of Zn is improved when there is the p-type GaAs cap layer 507 is partially removed will be described with reference to Table 1.

Table 1 shows the solid solubility limit concentration of Zn with respect to GaAs and AlGaInP respectively and the Zn concentrations of the p-type GaAs cap layer 507 and the p-type AlGaInP clad layer 505 provided in this embodiment before diffusing Zn. As can be seen from Table 1, the solid solubility limit concentration of Zn with respect to GaAs is lager than the Zn concentration of the p-type GaAs cap layer 507, but the solid solubility limit concentration of Zn with respect to AlGaInP is nearly equal to the Zn concentration of the p-type AlGaInP clad layer 505. Thus, the amount of Zn to be additionally doped into the p-type GaAs cap layer 507 is large, but the amount of Zn to be additionally doped into the p-type AlGaInP clad layer 505 is small. Therefore, Zn diffused from the ZnO film 509 to the p-type GaAs cap layer 507 is hardly diffused into the p-type GaInP hetero-barrier reduction layer 506 or the p-type AlGaInP clad layer 505 and is easily diffused into the p-type GaAs cap layer 507 in the lateral direction. When the concentration of Zn is saturated over a wider region than intended of the p-type GaAs cap layer 507, Zn begins to be diffused into the p-type GaInP hetero-barrier reduction layer 506 and the p-type AlGaInP clad layer 505 in a vertical direction so as to push out Zn which presents in the p-type GaInP hetero-barrier reduction layer 506 or the p-type AlGaInP clad layer 505 before diffusing Zn.

In the process of this invention, by blocking the path of Zn diffusion along the resonator direction, that is achieved by partially removing the p-type GaAs cap layer 507, it is possible to prevent Zn from being sequentially diffused into the p-type AlGaInP clad layer 505 in the resonator direction.

In Table 1, the solid solubility limit concentration of the p-type GaAs cap layer is based on data disclosed in Journal of Crystal Growth, 167 (1996), p. 17. The document discloses a method of estimating the solid solubility limit concentration of Zn with respect to GaAs from the concentration equilibrium between a vapor phase including a Zn compound and a solid phase composed of a GaAs semiconductor including Zn as impurities.

Moreover, in Table 1, the solid solubility limit concentration of the p-type AlGaInP layer is obtained by the experiments by the inventors. The solid solubility limit concentration of Zn to AlGaInP was estimated from a Zn concentration profile in the stacked direction by SIMS measurement. The method used in the estimation is disclosed in Physical Status Solid (a), 149 (1995), p. 557.

Further, the Zn concentrations of the p-type GaAs cap layer 507 and the p-type AlGaInP clad layer 505 provided in this embodiment before diffusing Zn are measured by SIMS measurement.

TABLE 1

| | Solid solubility limit concentration | Concentration of Zn atoms |
|---|---|---|
| p-type GaAs cab layer | >$10^{19}$ cm$^{-3}$ | 3 × $10^{18}$ cm$^{-3}$ |
| p-type AlGaInP layer | ~$10^{18}$ cm$^{-3}$ | 1 × $10^{18}$ cm$^{-3}$ |

Next, the measurement result of the wavelength of light corresponding to the band gap of the active layer will be described.

FIG. 5 is a graph illustrating the measurement results of the wavelengths of light corresponding to the band gaps of the active layers of the semiconductor laser ((a) of FIG. 5) according to this embodiment and a semiconductor laser ((b) of FIG. 5) according to a comparative example, which will be described below. In the graph, the horizontal axis indicates the distance from the end surface in the resonator direction, and the vertical axis indicates the peak wavelength of photoluminescence light. In addition, it is assumed that the wavelength of light at an end surface position (a position where the horizontal axis is 0 μm) is λw (nm), and the wavelength of light at the position where the horizontal axis is 100 μm is λa (nm). In FIG. 5, Lt indicates the length of the transition region.

The wavelength λw and the wavelength λa are the wavelength of light corresponding to the band gap of the quantum well active layer 504 at any position in each range. The wavelength of light is obtained by measuring the peak wavelength of photoluminescence light.

In this embodiment, the wavelength λa may be measured in a gain region at a position that is spaced a distance of equal to or more than (3/10)L and equal to or less than (7/10)L, or a distance of equal to or more than (4/10)L and equal to or less than (6/10)L from one end surface in the resonator direction. For example, the wavelength λa may be measured at any position in the distance range of equal to or more than 100 μm and equal to or less than 150 μm from the end surface in the resonator direction.

For example, a light absorbing layer, which is an obstacle to measurement, is partially removed for measurement, if necessary.

Since the band gap of the active layer in the transition region is different from that in the gain region, a gain for laser oscillation is not generated in the transition region. In addition, since the absorption spectrum of the semiconductor is spread from the peak wavelength, absorption loss with respect to laser oscillation light generated from the gain region, occurs in a portion of the transition region. Therefore, in order to effectively perform laser oscillation, it is preferable that Lt be small.

As shown in (a) of FIG. 5, in the semiconductor laser according to this embodiment, the wavelength varies greatly as the distance along the horizontal axis increases. In contrast, as shown in (b) of FIG. 5, in the semiconductor laser according to comparative example, the wavelength varies moderately as the distance along the horizontal axis increases.

The length of the transition region, Lt is 12 μm in (a) of FIG. 5 and 46 μm in (b) of FIG. 5.

As such, in the semiconductor laser according to this embodiment, the length of the transition region, Lt is smaller than that in the comparative example. Therefore, it is possible to prevent absorption loss and reduce a threshold current value.

Next, the operation and effects of this embodiment will be described.

The semiconductor laser according to this embodiment has a window structure in which the quantum well active layer 504 in the regions near both end surfaces is alloyed and the band gap of the quantum well active layer 504 in the region near the end surface is wider than that of the quantum well active layer 504 in the gain region (region other than the region near the end surface). Since the region with a wider band gap functions as a transparent window that does not absorb laser oscillation light, it is possible to significantly increase the level where optical damage (COD) occurs. In this way, it is possible to achieve a semiconductor laser with high stability.

In the semiconductor laser, if $\lambda a - \lambda w > 15$ nm, it is possible to prevent the occurrence of COD.

Since $\lambda a - \lambda w > 15$ nm and the length of the transition region, Lt is less than 25 μm, as shown in FIG. 5, the band gap of the quantum well active layer 504 varies sharply in the resonator direction from both ends. Therefore, it is possible to narrow a non-gain region in which the gain is not generated and widen the gain region. In addition, it is possible to prevent propagation loss. As a result, it is possible to obtain a sufficient gain and reduce a threshold current value. In particular, these effects are remarkable in a laser that has a relative short resonator length and is for playing back an optical disk.

As the length of the transition region, Lt is smaller, loss due to light absorption is reduced. However, when the Lt is excessively small, a large variation in refractive index occurs at the boundary between the diffusion and non-diffusion regions, and the loss of guided light is increased due to scattering. Therefore, Lt is preferably equal to or more than 1 μm, and more preferably, equal to or more than 3 μm.

In this embodiment, in the case of a self-oscillation semiconductor laser, it is preferable that the length of the transition region, Lt be equal to or less than 12 μm and equal to or more than 1 μm.

As described above, in the semiconductor laser of this embodiment in which the band gap of the active layer near the end surface is wide enough not to absorb laser oscillation light, it is possible to achieve a structure capable of reducing a threshold current value and obtaining stable self-oscillation by narrowing the region in which the band gap of the active layer varies in the resonator direction from the end surface, that is, sharply changing the band gap of the region near the end surface.

If Lt is less than 25 μm but the value of $\lambda a - \lambda w$ is equal to or less than 15 nm, the difference between the band gap of the non-gain region and the band gap of the gain region is reduced, and it is difficult to sufficiently prevent the occurrence of COD.

Comparative Example

Next, a semiconductor laser according to the comparative example which corresponds to the semiconductor laser disclosed in Japanese Unexamined Patent Publication No. 2007-318077 will be described. The semiconductor laser according to the comparative example is manufactured by the following process.

Figure 13A:
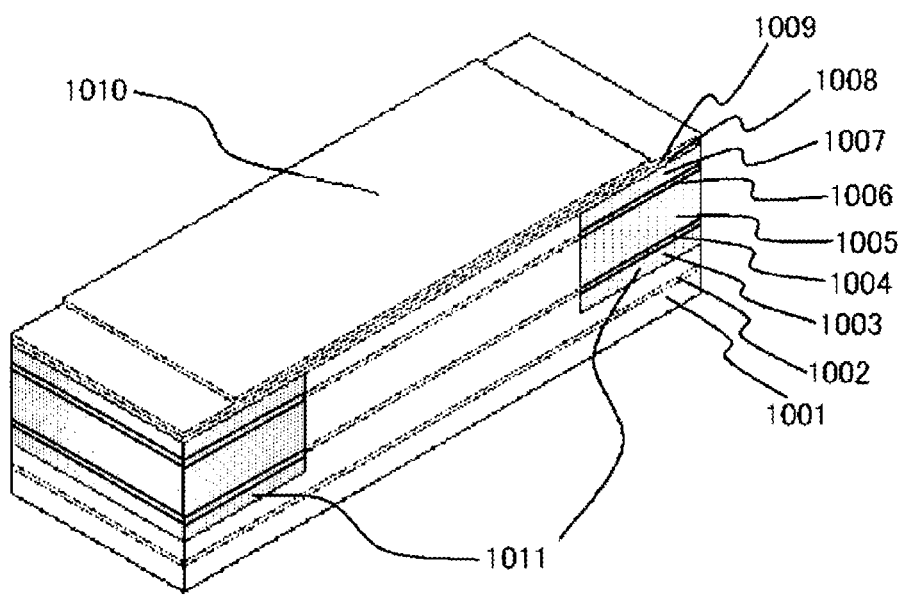
FIGS. 13A and 13B are diagrams illustrating a process of manufacturing the semiconductor laser according to the comparative example.
Figure 13B:
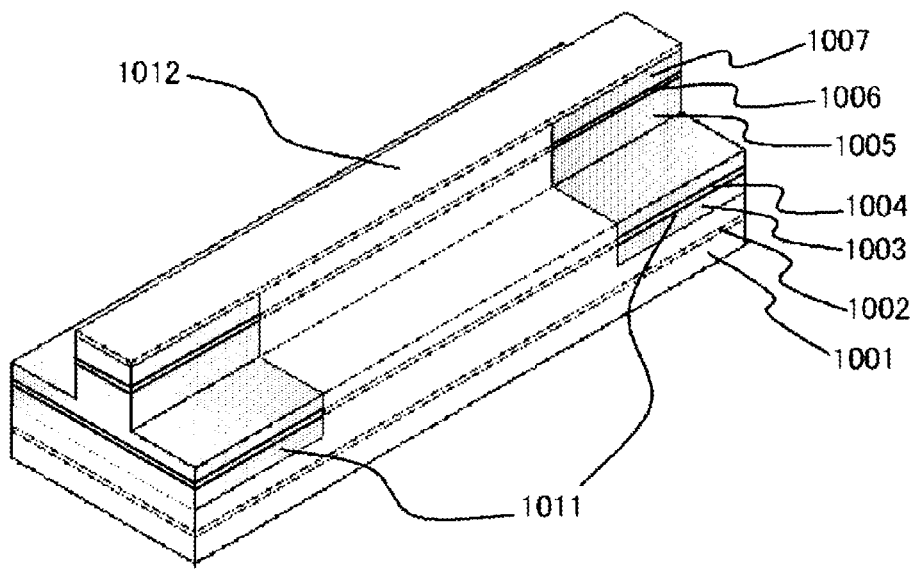
Figure 14A:
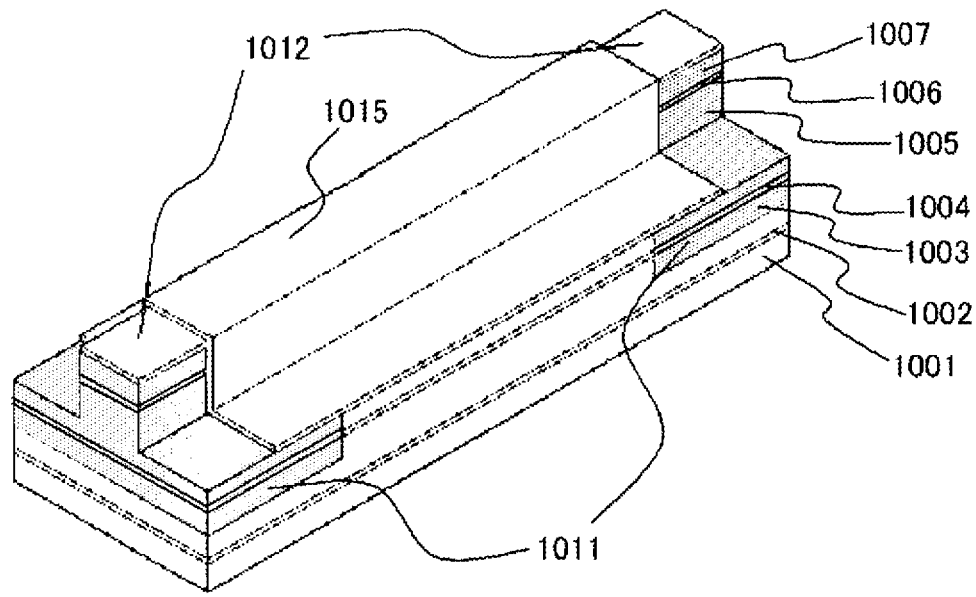
FIGS. 14A and 14B are diagrams illustrating the process of manufacturing the semiconductor laser according to the comparative example.
Figure 14B:
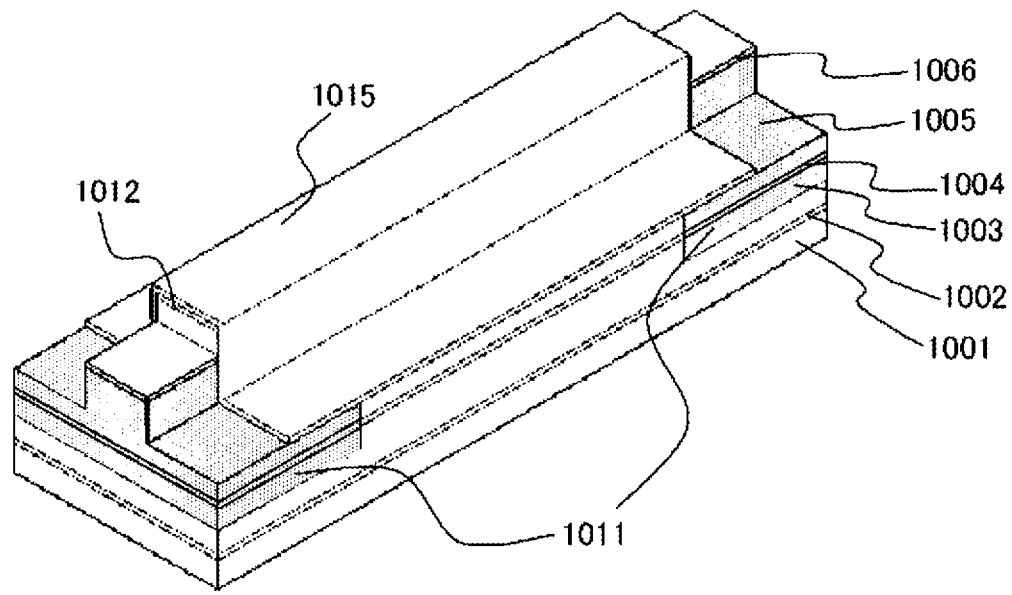
Figure 15A:
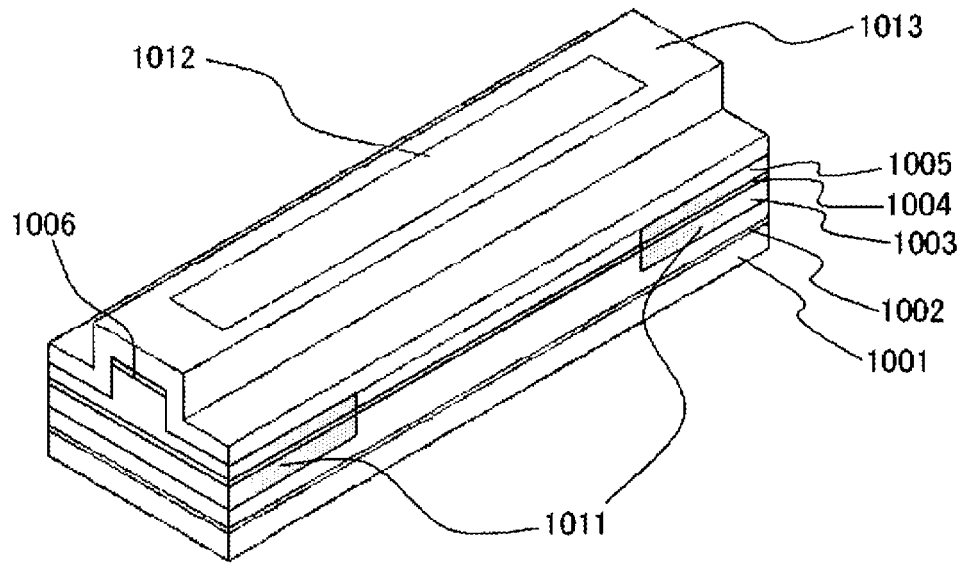
FIGS. 15A and 15B are diagrams illustrating the process of manufacturing the semiconductor laser according to the comparative example.
Figure 15B:
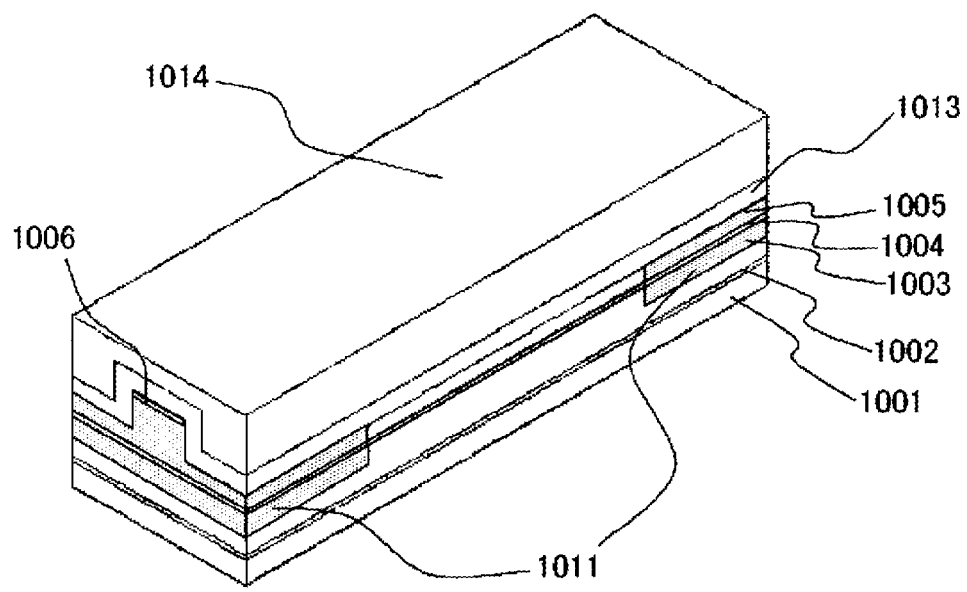
Figure 16A:
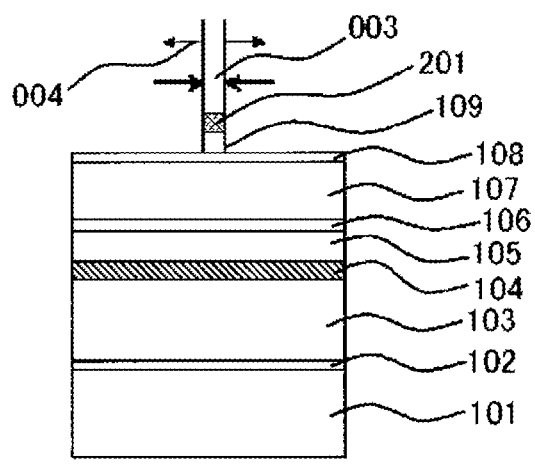
FIGS. 16A to 16C are diagrams illustrating a process of manufacturing a semiconductor laser according to the related art.
Figure 16B:
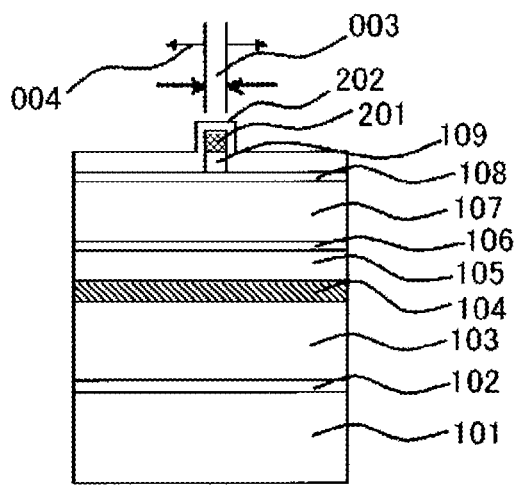
Figure 16C:
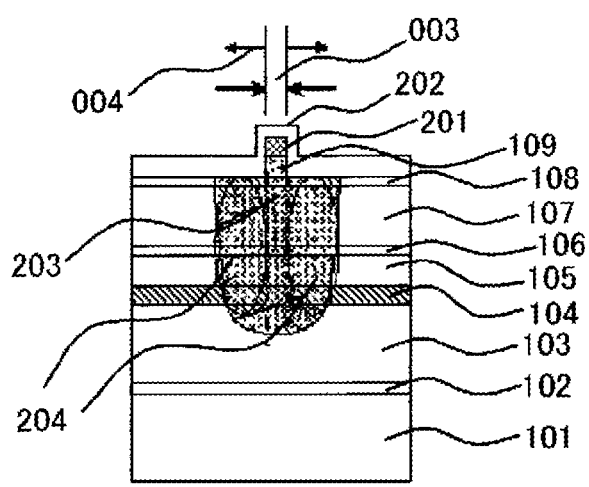
Figure 17A:
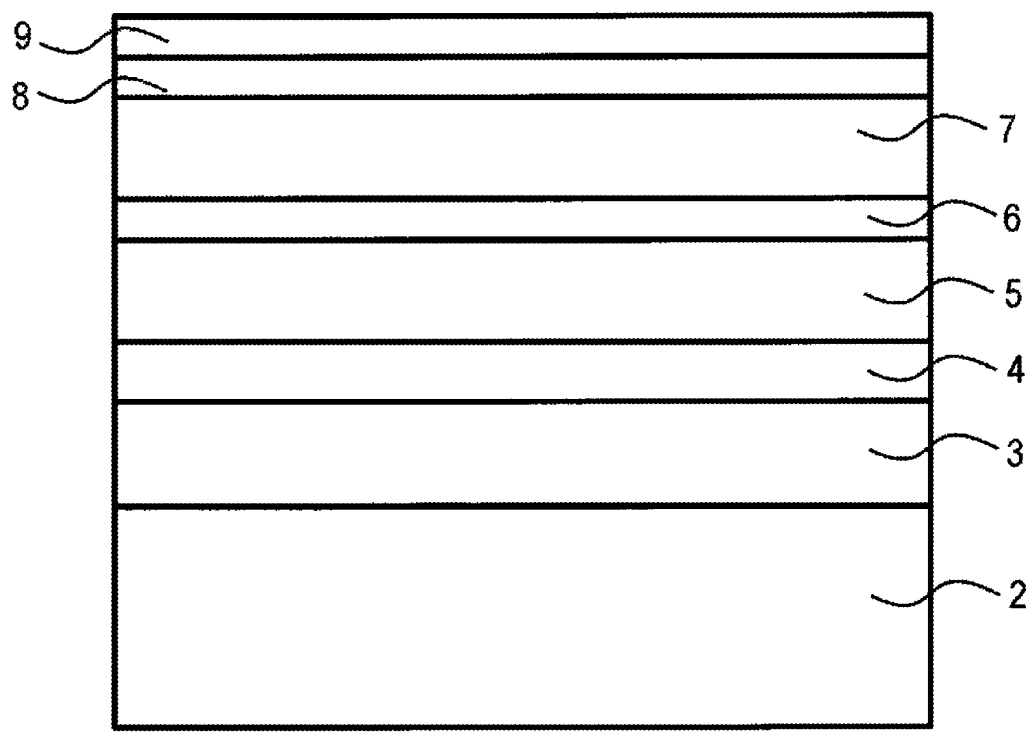
FIGS. 17A to 17D are diagrams illustrating a process of manufacturing a semiconductor laser according to the related art.
Figure 17B:
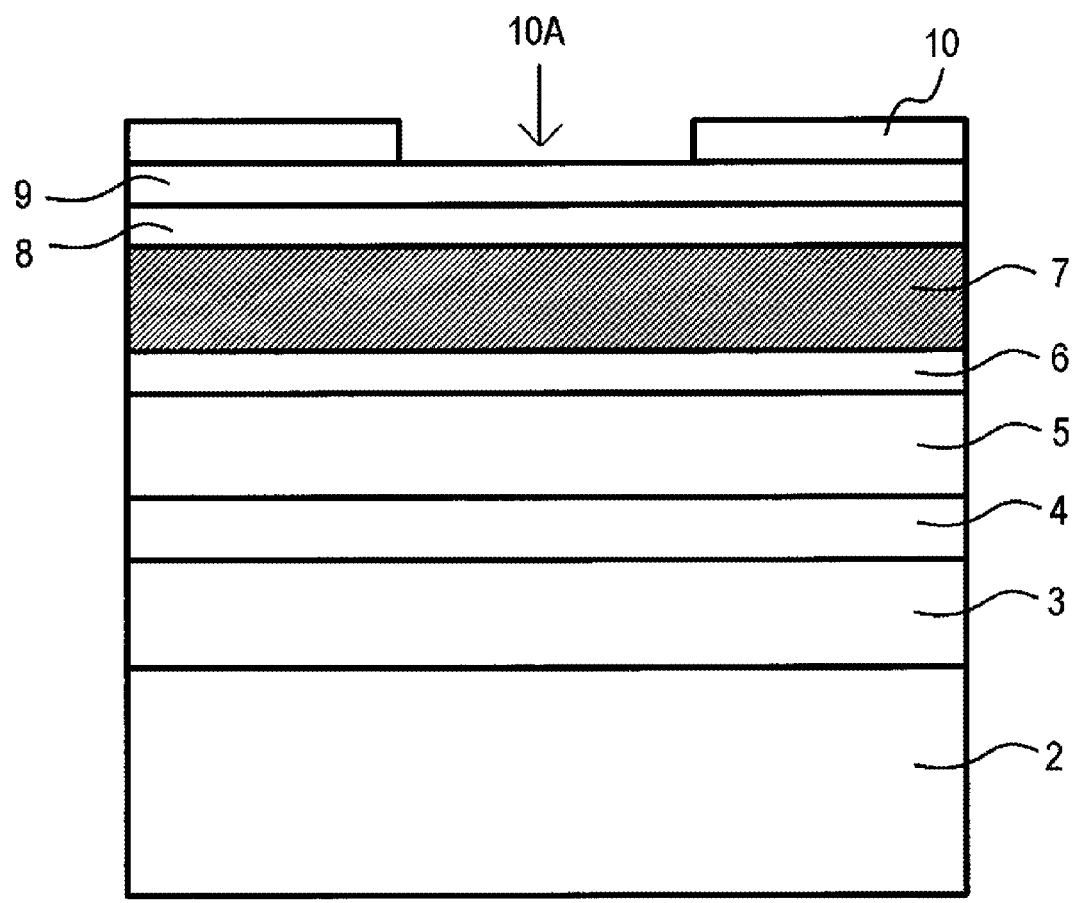
Figure 17C:
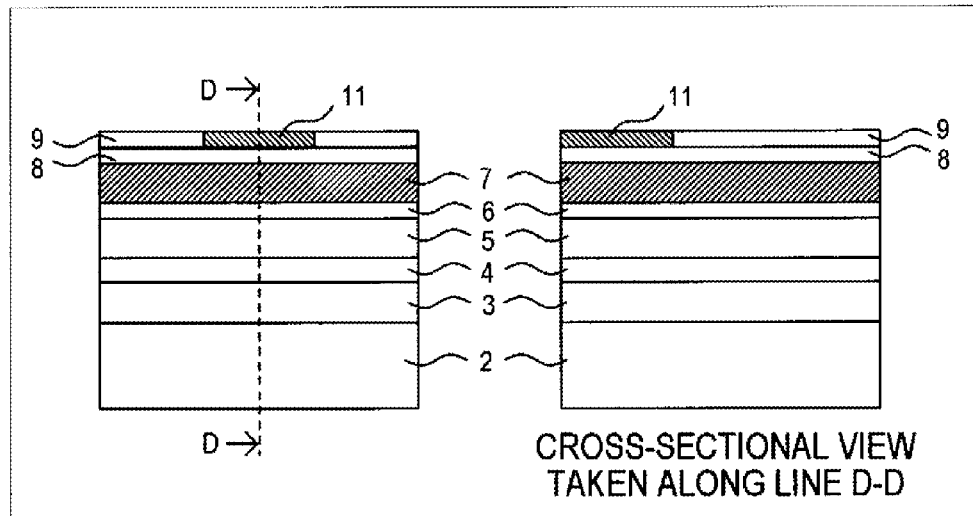
Figure 17D:
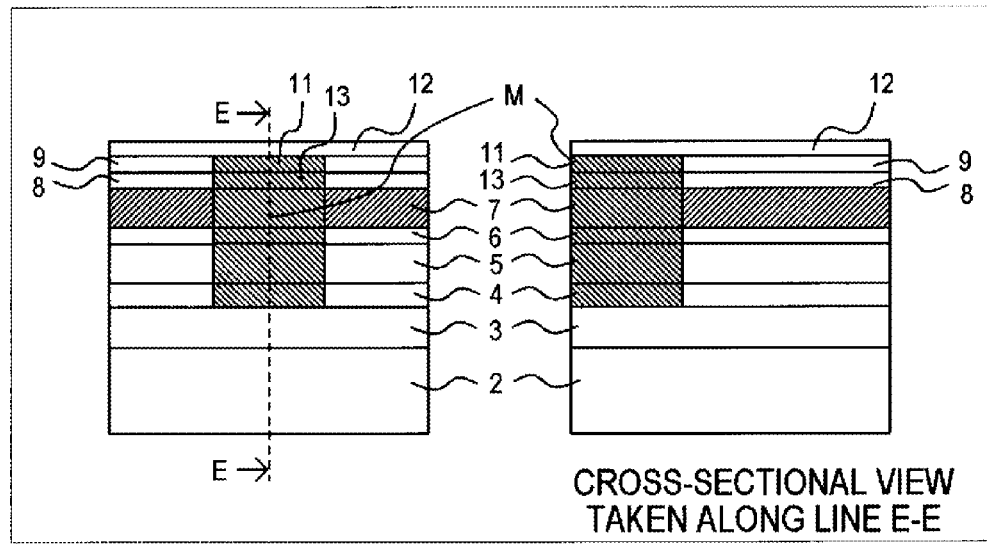

First, as shown in FIG. 13A, an n-type GaInP hetero-barrier reduction layer 1002, an n-type AlGaInP clad layer 1003, a quantum well active layer 1004, a p-type AlGaInP clad layer 1005, a p-type GaInP hetero-barrier reduction layer 1006, and a p-type GaAs cap layer 1007 are sequentially stacked on an n-type GaAs substrate 1001 by one epitaxial growth, and a $SiO_2$ film 1008 is formed on the p-type GaAs cap layer 1007 by CVD and photolithography. The $SiO_2$ film 1008 is opened in a region corresponding to near the end surface of an LD chip. Then, a ZnO film 1009 and a $SiO_2$ film 1010 are formed by a sputtering method. Then, when the product is heated at a temperature of about 600° C. for 10 to 30 minutes, Zn atoms are diffused from a contact portion between the p-type GaAs cap layer 1007 and the ZnO film 1009 to a semiconductor, and a Zn diffused region 1011 represented by a deep-color portion shown in FIG. 13A is formed. Then, the $SiO_2$ film 1008, the ZnO film 1009, and the $SiO_2$ film 1010 are removed. Then, as shown in FIG. 13B, the semiconductor is removed to a depth of 0.2 to 0.4 μm from the upper surface of the quantum well active layer 1004 by wet etching or dry etching using a $SiO_2$ strip 1012 that is formed by CVD and photolithography as an etching mask, thereby forming a ridge. Then, a resist film 1015 is formed as shown in FIGS. 14A and 14B, and portions of the $SiO_2$ strip 1012 and the p-type GaAs cap layer 1007 near the end surface are removed by photolithography and etching. Then, the resist film 1015 is removed and an n-type current block layer 1013 and a p-type contact layer 1014 are formed by second and third epitaxial growth processes, as shown in FIGS. 15A and 15B. Then, the upper and lower electrodes are formed, and the semiconductor is divided such that the Zn-diffused region 1011 includes the end surface. In this way, a semiconductor laser chip according to the comparative example is obtained.

(Comparison Between Embodiment and Comparative Example)

Next, the effects of this embodiment compared to the comparative example will be described.

When the semiconductor laser according to the comparative example is manufactured by the above-mentioned manufacturing process, Zn is diffused in the resonator direction, the non-gain region of the active layer is widened, and the length of the transition region, Lt is equal to or more than 25 μm. This causes an increase in threshold current value.

That is, in the semiconductor laser according to the comparative example, if Lt is equal to or more than 25 μm and the band gap of the active layer is slowly reduced from the end surface to the inside of the resonator, the area of the non-gain region is increased, and the gain is likely to be insufficient, which results in an increase in threshold current value. In particular, in the laser for playing back an optical disk that has a relatively small resonator length, this phenomenon is remarkable. In addition, in a device using a fine balance between gain and loss, such as the self-oscillation laser, it is likely difficult for self-oscillation to occur.

In contrast, in the process of manufacturing the semiconductor laser according to this embodiment, as described above, since $\lambda a - \lambda w > 15$ nm and Lt is less than 25 μm, it is possible to achieve a small semiconductor laser. Therefore, the band gap of the quantum well active layer 504 varies greatly in the resonator direction from the end surface. In this way, it is possible to narrow the non-gain region and widen the gain region. In addition, it is possible to prevent propagation loss. As a result, it is possible to obtain a sufficient gain and reduce a threshold current value. In particular, the effects are remarkable in the laser for playing back an optical disk that has a relative small resonator length. Further, in this embodiment, it is possible to maintain the balance between the gain and the loss. Therefore, it is possible to achieve stable self-oscillation in the self-oscillation semiconductor laser.

Next, the effects of the manufacturing method according to this embodiment compared to that of the manufacturing method according to the comparative example will be described.

Figure 7A:
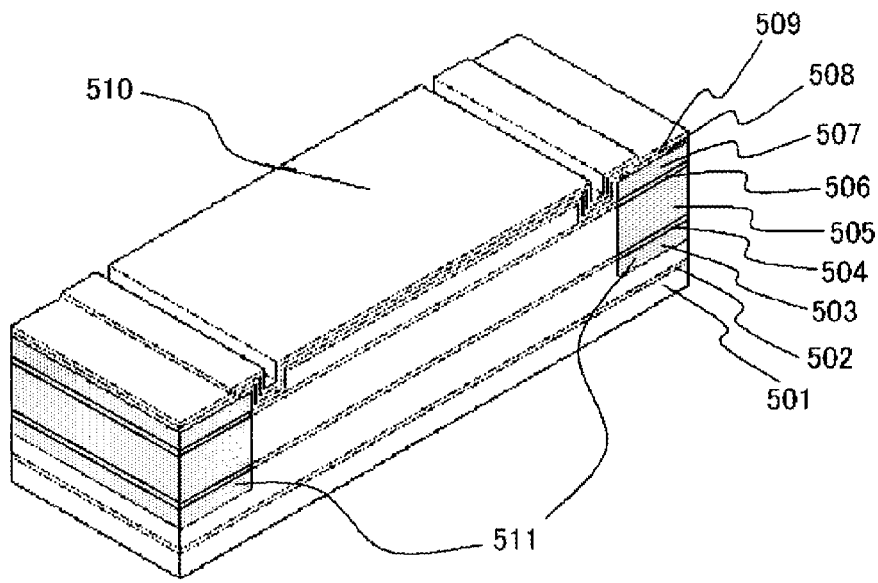
FIGS. 7A and 7B are diagrams illustrating the difference between a Zn diffusion process of a method of manufacturing the semiconductor laser according to the embodiment of the invention and a Zn diffusion process of a method of manufacturing the semiconductor laser according to a comparative example.
Figure 7B:
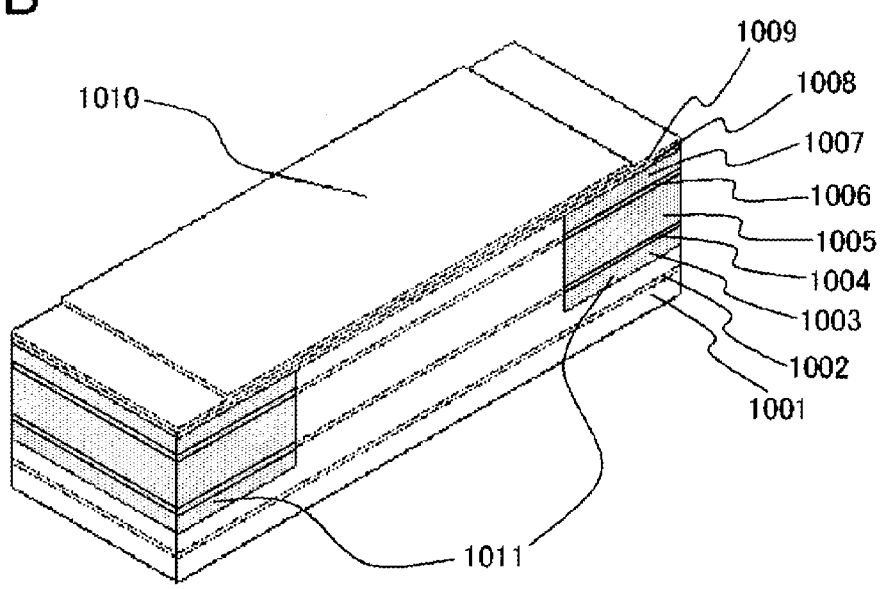

The process of manufacturing the semiconductor laser according to this embodiment is different from the process of manufacturing the semiconductor laser according to the comparative example in a Zn diffusing process (FIGS. 7A and 7B). The curves of the photoluminescence peak wavelengths shown in (a) and (b) of FIG. 5 correspond to the structures shown in FIGS. 7A and 7B, respectively.

In the process of manufacturing the semiconductor laser according to the comparative example, as shown in FIG. 7B, the p-type GaAs cap layer 1007 is formed above the entire surface of the quantum well active layer 1004. Therefore, when a heating process is performed with the p-type GaAs cap layer 1007 and the ZnO film 1009 coming into contact with each other, Zn is diffused into the quantum well active layer 1004 in the resonator direction through the p-type GaAs cap layer 1007. Then, the Zn diffused region 1011 is widened, and the non-gain region of the quantum well active layer 1004 is also widened.

In contrast, in the process of manufacturing the semiconductor laser according to this embodiment, as shown in FIG. 7A, a portion of the uppermost p-type GaAs cap layer 507 is removed and a separation groove is formed. The separation groove may separate a region where the region near the end surface is to be formed from a region where the gain region is to be formed in the p-type GaAs cap layer 507. Since the ZnO film 509 comes into contact with only the p-type GaAs cap layer 507 in the region where the region near the end surface is to be formed, it is possible to prevent Zn from being diffused into the p-type GaAs cap layer 507 in the region where the gain region is to be formed over the separation groove. In addition, the $SiO_2$ film 508 is inserted in the groove such that Zn is not diffused into the p-type GaAs cap layer 507 in the region where the gain region is to be formed.

As shown in FIGS. 7A and 7B, after the heat treatment, the portions having Zn diffused thereinto become the Zn-diffused region 511 and the Zn-diffused region 1011. In FIG. 7B, since the p-type GaAs cap layer is not cut, a large amount of Zn is diffused in the lateral direction. In contrast, in FIG. 7A, Zn is diffused to only the boundary from the portion in which the p-type GaAs cap layer is removed in the lateral direction. Therefore, the length of the Zn-diffused region 511 according to this embodiment of the invention in the resonator direction is smaller than that of the Zn-diffused region 1011 of the comparative example.

As such, the diffusion of Zn of this embodiment in the resonator direction is suppressed than that of the comparative example. Therefore, in the manufacturing process according to this embodiment, it is possible to reduce the length of the transition region, Lt. That is, it is possible to sharply change the band gap of the active layer from the window region to the inside of the resonator.

In this embodiment, even when the p-type GaAs cap layer 507 is entirely removed to form the ZnO film 509 and the $SiO_2$ film 508, the diffusion of Zn in the lateral direction is prevented. However, when a layer (for example, the p-type AlGaInP clad layer 505 or the p-type GaInP hetero-barrier reduction layer 506) made of a semiconductor, such as a GaInP layer or a AlGaInP layer, other than the GaAs layer (p-type GaAs cap layer 507) is exposed, the structure is likely to be damaged by, for example, a heat treatment and a plasma process in the manufacturing process, and a defect may spread from the surface of the semiconductor to the inside, which may result in the alloying of the quantum well active layer 504 and a widening in the band gap. In this embodiment, the ZnO film 509, which is a Zn diffusion source, is easily formed by the sputtering method. However, a semiconductor crystal as a base, is more damaged by the sputtering method than by the CVD method. Therefore, the sputtering method requires special care. In consideration of the above points, the p-type GaAs cap layer 507 may not be partially removed in this embodiment.

As described above, in this embodiment, after the p-type GaAs cap layer 507 is partially removed, Zn is diffused. Therefore, the diffusion of Zn in the resonator direction is prevented. In addition, the region in which the p-type GaAs cap layer 507 is removed is minimized. Therefore, it is possible to prevent the deterioration of crystal quality, such as a semiconductor defect during a heat treatment and a plasma process, and prevent the band gap of the active layer in an unnecessary region from being widened.

Next, the effects of this embodiment compared to the comparative example in an AlGaInP-based semiconductor laser using a self-oscillation operation will be described with reference to FIGS. 6A and 6B.

FIGS. 6A and 6B are graphs illustrating the results when an interference spectrum, which is an index for the stability of self-oscillation, is calculated and coherence, which is the ratio between the primary (zero-order) peak intensity and the first-order peak intensity of the interference spectrum, is calculated. In the graphs, the measured values of 100 or more semiconductor laser elements are represented as histograms. In general, the smaller the coherence becomes, the more stable a self-oscillation operation becomes.

FIG. 6A shows the results obtained from the structure having a small Lt according to this embodiment, and FIG. 6B shows the results obtained from the structure having a large Lt according to the comparative example. The graphs correspond to elements having the same structure as the elements having the photoluminescence peak wavelengths shown in (a) and (b) of FIG. 5.

In the structure of the semiconductor laser according to the comparative example, since the coherence is large, the self-oscillation operation is unstable.

In contrast, in the structure of the semiconductor laser according to this embodiment, since the coherence is small, the self-oscillation operation is stable.

As described above, in the semiconductor laser according to this embodiment, it is possible to achieve stable self-oscillation by reducing Lt and finely balancing the gain and the loss.

It is preferable that the length of the transition region, Lt be small in terms of the following points: when the loss region or the non-gain region is widened, it is likely difficult to obtain self-oscillation; self-oscillation is likely to be affected by the magnitude relationship between the gain and the loss; and other characteristic points.

Second Embodiment

Next, a second embodiment of the invention will be described with reference to FIGS. 8 to 11.

Figure 8:
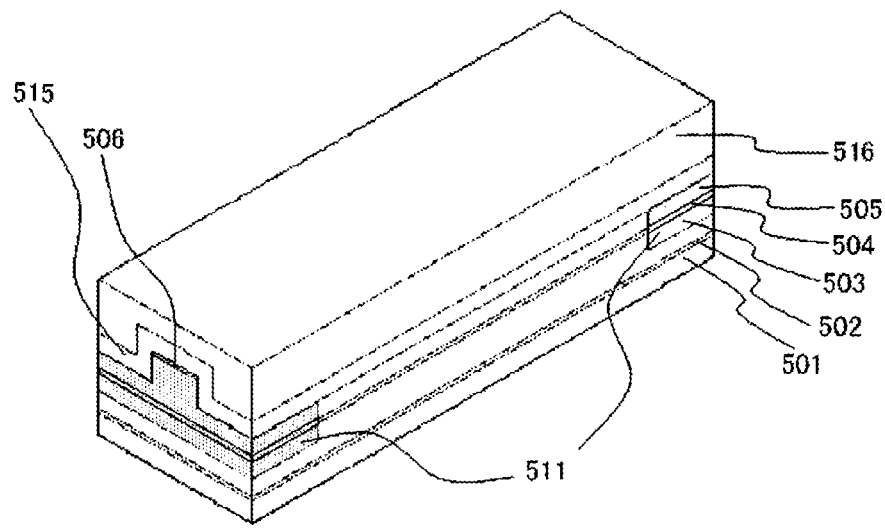
FIG. 8 is a perspective view illustrating the structure of a semiconductor laser according to a second embodiment of the invention.
Figure 9:
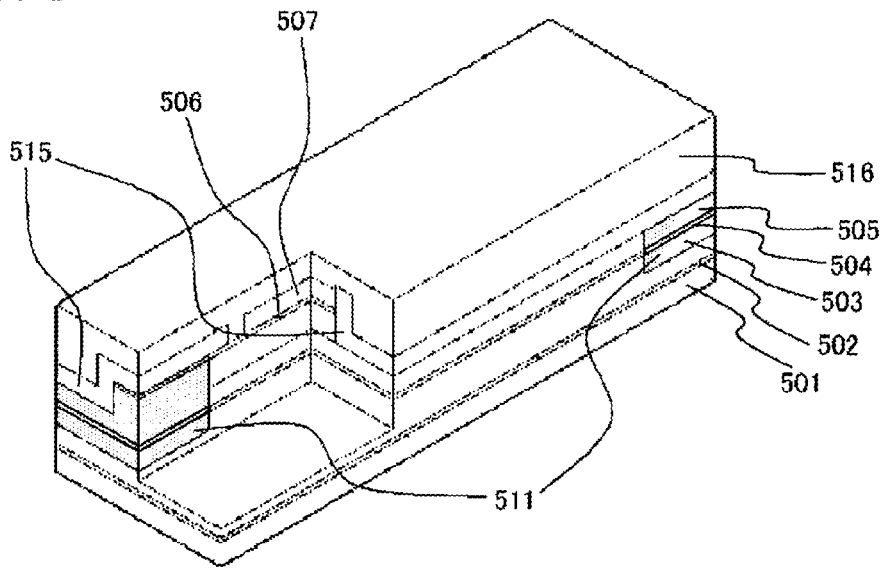
FIG. 9 is a perspective view illustrating the structure of the semiconductor laser according to the second embodiment of the invention.

FIG. 8 is a perspective view illustrating the structure of a semiconductor laser according to the second embodiment. FIG. 9 is a perspective view illustrating the semiconductor laser when a portion of the structure shown in FIG. 8 is removed to facilitate understanding of the internal structure thereof.

Figure 10A:
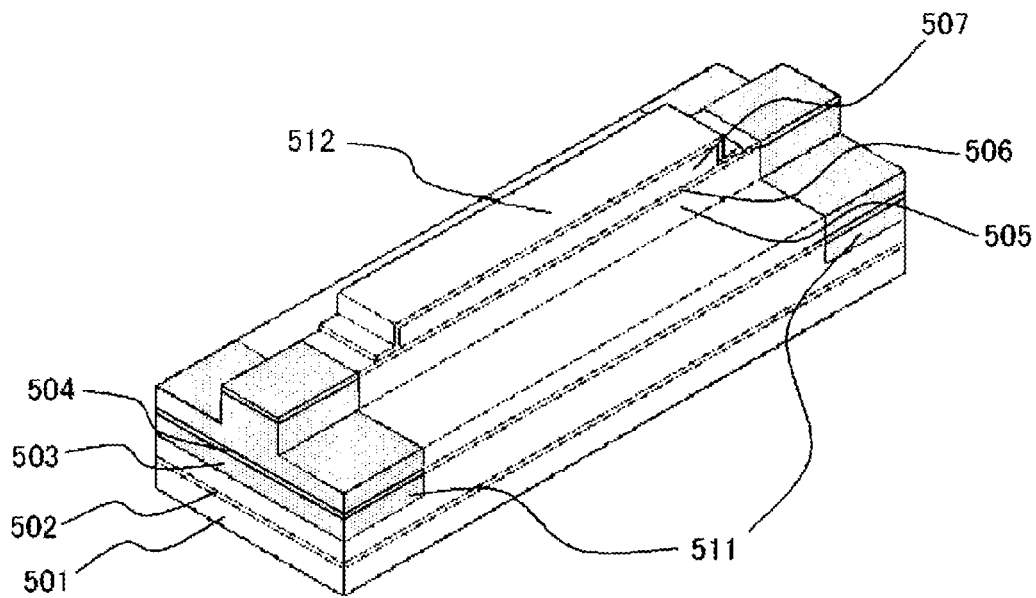
FIGS. 10A and 10B are diagrams illustrating a process of manufacturing the semiconductor laser according to the second embodiment of the invention.
Figure 10B:
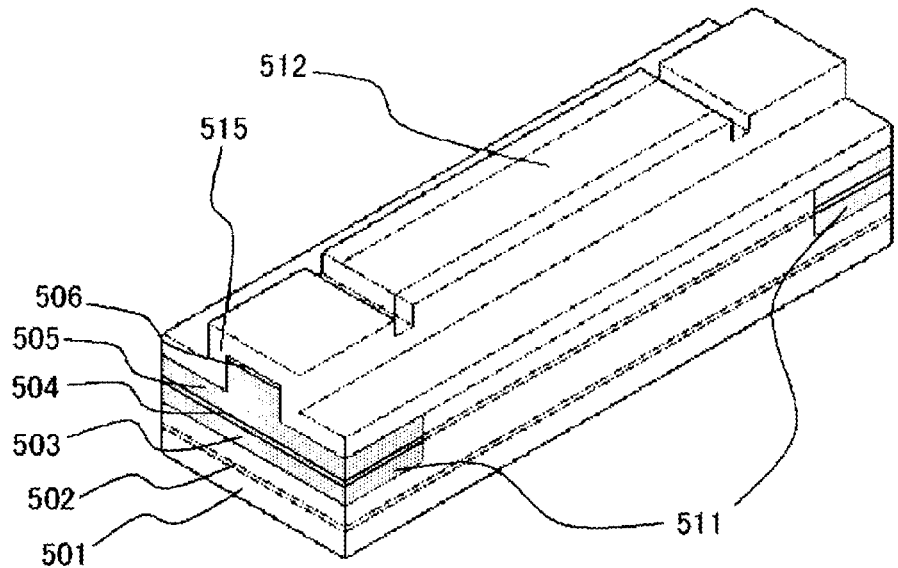
Figure 11:
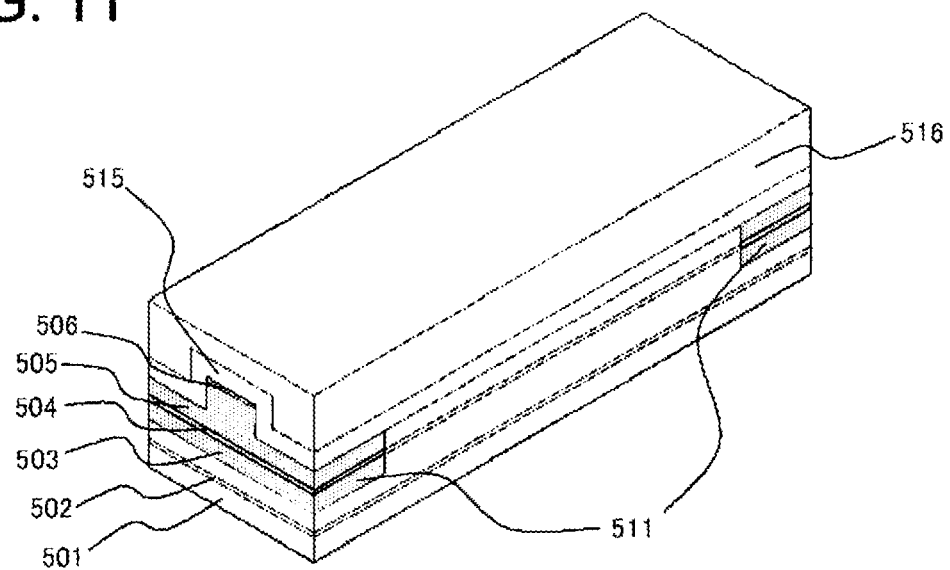
FIG. 11 is a diagram illustrating the process of manufacturing the semiconductor laser according to the second embodiment of the invention.

FIGS. 10A and 10B and FIG. 11 are diagrams illustrating a process of manufacturing the semiconductor laser according to the second embodiment.

The second embodiment differs from the first embodiment in that a current block structure is provided over an upper part of the p-type AlGaInP clad layer 505 in the region near the end surface.

In the second embodiment, after the process corresponding to FIG. 3B in the first embodiment is conducted, a process shown in FIG. 10A is performed. Specifically, the SiO₂ film 512 and the p-type GaAs cap layer 507 disposed from the concave portion of the p-type GaAs cap layer 507 shown in FIG. 3B to the end surface are removed by, for example, a photolithography method. Then, an n-type current block layer 515 is formed on the p-type AlGaInP clad layer 505 (FIG. 10B).

In this way, it is possible to remove the p-type GaAs cap layer 507 on the p-type AlGaInP clad layer 505 and form the n-type current block layer 515 on the p-type AlGaInP clad layer 505 in the region near the end surface.

After the SiO₂ film 512 is removed, a p-type GaAs contact layer 516 is formed (FIG. 11). Then, a laser chip is manufactured by the same process as that in the first embodiment. In this way, it is possible to obtain the semiconductor laser according to the second embodiment.

In the first embodiment, in the region near the end surface, since Zn is diffused downward, a pn junction portion is in the middle of the n-type AlGaInP clad layer 503. In a general structure using the semiconductor laser, the band gap of the clad layer is wider than that of the active layer. The second embodiment also has this structure. Therefore, even when a current block structure is not provided near the end surface, a current is less likely to flow through the region near the end surface than other regions, because the end surface portion has a so-called remote junction. However, when a voltage with a predetermined level or more is applied, a pn junction is turned on near the end surface having a remote junction and a current may flow. This phenomenon easily occurs in the voltage range that is generally used by the semiconductor laser, but the gain is not generated near the end surface where the band gap of the active layer is large even when a current is injected. As a result, the threshold current value of the semiconductor laser increases. In addition, the flow of a current near the end surface accelerates the deterioration of the end surface, which may prevent the long-time operation of the semiconductor laser. In order to further improve the effects obtained by the window structure, it is preferable that a current block structure be provided near the end surface, as in the second embodiment.

As other embodiments, a so-called ridge structure may be used in which the n-type AlInP/GaAs current block layer 513 and the p-type GaAs contact layer 514, or the n-type current block layer 515 and the p-type GaAs contact layer 516 are stacked.

Third Embodiment

Next, a third embodiment of the invention will be described with reference to FIGS. 12A and 12B.

Figure 12A:
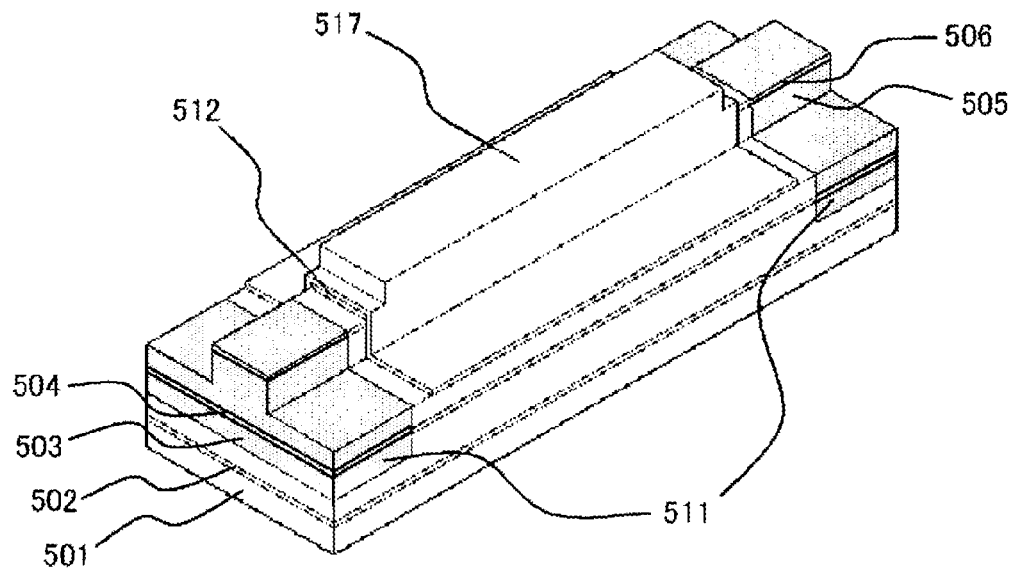
FIGS. 12A and 12B are diagrams illustrating a process of manufacturing a semiconductor laser according to a third embodiment of the invention.
Figure 12B:
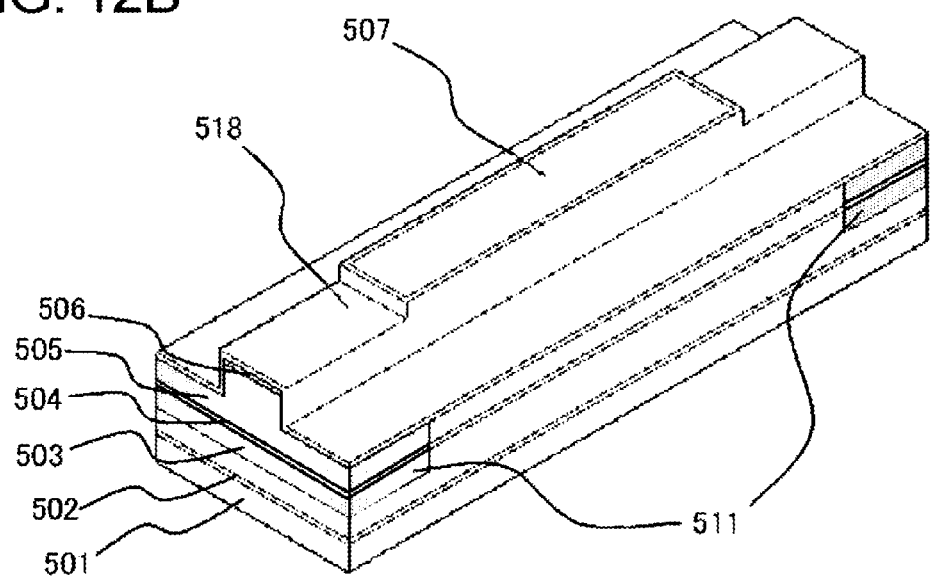

FIGS. 12A and 12B are diagrams illustrating a process of manufacturing a semiconductor laser according to the third embodiment of the invention.

In the third embodiment, the same process as that in the first embodiment shown in FIG. 3B is conducted. After the process, as shown in FIG. 12A, a region where the region near the end surface is to be formed in the SiO₂ film 512 and the p-type GaAs cap layer 507 is removed by CVD, photolithography, and etching. Then, as shown in FIG. 12B, a photoresist 517 and the SiO₂ film 512 are entirely removed, and the SiO₂ film 518 only in a region on which current injection is desired to be performed is opened by CVD, photolithography, and etching. Then, a laser chip is obtained by the same process as that in the first embodiment. In this way, it is possible to obtain the semiconductor laser according to the third embodiment.

In the first and second embodiments, a thermal history corresponding to crystal growth after forming the ridge is added. However, in the third embodiment, since there is no addition of the thermal history, it is possible to easily control Zn diffusion.

However, it is preferable to use a low-damage process such as CVD for the formation of a SiO₂ film on both sides of the ridge after the p-type AlGaInP clad layer 505 is exposed, in consider of preventing a crystal quality from being reduced.

A method of diffusing impurities in the method of manufacturing the semiconductor laser may be applied to a general case. That is, when there are solid A and solid B having different solid solubility limits with respect to an impurity C, the solid solubility limit of the solid A is large, and the impurity C is diffused from the solid A to the solid B, it is possible to prevent the impurity C from being diffused in the lateral direction by removing a portion of the solid A.

That is, as the impurity diffusion method, a method of diffusing impurities into a semiconductor layer B through a semiconductor layer A may be used. The impurity diffusion method includes the following processes (1) to (3):

Process (1): the semiconductor layer A and the semiconductor layer B are prepared, and when the solid solubility limit concentration of the semiconductor layer A with respect to impurities is Ma and the solid solubility limit concentration of the semiconductor layer B with respect to the impurities is Mb (Ma>Mb), the semiconductor layer A is formed on the semiconductor layer B;

Process (2): a groove is formed in the semiconductor layer A, and a first semiconductor layer A and a second semiconductor layer A are formed on the semiconductor layer B; and Process (3): a layer including impurities is formed so as to come into contact with only the surface of the first semiconductor layer A, and the impurities are diffused into the semiconductor layer B through the first semiconductor layer A.

According to the semiconductor laser of this embodiment, it is possible to achieve a high COD level and a high electrostatic discharge (ESD) level without damaging an oscillation threshold current, efficiency, or self-excited operation characteristics.

The semiconductor laser according to the embodiment of the invention may be used as, for example, a light source of an optical disk device. In addition, the self-oscillation semiconductor laser according to the embodiment of the invention may be used as a DVD playback light source.

In Process (3), an opening may be formed in the SiO₂ film 508, the opening may be exposed to gas including impurities, and the gas may come into contact with the only surface of the p-type GaAs cap layer 507 in a region where the region near the end surface is to be formed. In this way, it is possible to prevent the diffusion of Zn in the resonator direction of the quantum well active layer 504, similar to the method forming the ZnO film 509.

Any gas including Zn may be used as the gas including impurities. For example, diethyl zinc (DEZ) may be used.

The above-described embodiments and a plurality of modifications may be combined with each other without departing from the scope of the invention. In the above-described embodiments and modifications, the structure of each component has been described in detail, but the structure may be changed in various ways without departing from the scope of the invention.

It is apparent that the present invention is not limited to the above embodiment, and may be modified and changed without departing from the scope and spirit of the invention.

What is claimed is:

1. A method of manufacturing a semiconductor laser, comprising:

forming an active layer over a substrate; and diffusing impurities into a region near an end surface of said active layer to alloy said active layer, wherein said alloying said active layer includes:

preparing a semiconductor layer A and a semiconductor layer B;

sequentially forming said semiconductor layer B and said semiconductor layer A over said active layer when the solid solubility limit concentration of said semiconductor layer A with respect to said impurities is Ma and the solid solubility limit concentration of said semiconductor layer B with respect to said impurities is Mb (Ma>Mb);

forming a groove in said semiconductor layer A between a region where said region near said end surface is to be formed and a region where a region other than said region near said end surface is to be formed; and forming a layer including said impurities so as to come into contact with only the surface of said first semiconductor layer A in said region where said region near said end surface is to be formed or exposing only the surface of said semiconductor layer A in said region where said region near said end surface is to be formed to a gas including said impurities, and diffusing said impurities into said active layer in said region where said region near said end surface is to be formed through said semiconductor layer A and said semiconductor layer B.

2. The method of manufacturing a semiconductor laser as set forth in claim 1, wherein, when said semiconductor layer A is a cap layer and said semiconductor layer B is a clad layer, said cap layer remains over said clad layer in said region where said region other than said region near said end surface is to be formed.

3. The method of manufacturing a semiconductor laser as set forth in claim 1, wherein, when said semiconductor layer A is a cap layer and said semiconductor layer B is a clad layer, said cap layer remains over said clad layer in said region where said region near said end surface is to be formed.

4. The method of manufacturing a semiconductor laser as set forth in claim 1, wherein, when said semiconductor layer A is a cap layer and said semiconductor layer B is a clad layer, said cap layer over said clad layer is removed in said region where said region near said end surface is to be formed, and a current block layer is formed over said clad layer.

5. The method of manufacturing a semiconductor laser as set forth in claim 4, wherein said current block layer is a single layer or a multi-layer structure.

6. The method of manufacturing a semiconductor laser as set forth in claim 1, wherein said step of forming said groove includes:

forming a layer that prevents the diffusion of said impurities, in said groove.

7. The method of manufacturing a semiconductor laser as set forth in claim 1, wherein said impurities are Zn.

8. The method of manufacturing a semiconductor laser as set forth in claim 1, wherein a material forming said semiconductor layer B includes GaInP, AlGaInP, or AlGaAs.

9. The method of manufacturing a semiconductor laser as set forth in claim 1, wherein a material forming said semiconductor layer A includes GaAs.

10. The method of manufacturing a semiconductor laser as set forth in claim 1, wherein said layer including said impurities is a ZnO film formed by a sputtering method.

11. The method of manufacturing a semiconductor laser as set forth in claim 1, wherein said semiconductor laser is self-oscillated.

12. A method of diffusing impurities into a semiconductor layer B through a semiconductor layer A, comprising:

preparing said semiconductor layer A and said semiconductor layer B;

forming said semiconductor layer A over said semiconductor layer B when the solid solubility limit concentration of said semiconductor layer A with respect to said impurities is Ma and the solid solubility limit concentration of said semiconductor layer B with respect to said impurities is Mb (Ma>Mb);

forming a groove in said semiconductor layer A, to form a first semiconductor layer A and a second semiconductor layer A over said semiconductor layer B; and forming a layer including said impurities so as to come into contact with only the surface of said first semiconductor layer A and diffusing said impurities into said semiconductor layer B through said first semiconductor layer A.

13. The method of diffusing impurities as set forth in claim 12, wherein said impurities are Zn.

14. The method of diffusing impurities as set forth in claim 12, wherein a material forming said semiconductor layer B includes GaInP, AlGaInP, or AlGaAs.

15. The method of diffusing impurities as set forth in claim 12, wherein a material forming said semiconductor layer A includes GaAs.

* * * * *